(12) United States Patent
Palle et al.

(10) Patent No.: US 9,773,886 B1
(45) Date of Patent: Sep. 26, 2017

(54) NANOSHEET AND NANOWIRE DEVICES HAVING DOPED INTERNAL SPACERS AND METHODS OF MANUFACTURING THE SAME

(71) Applicant: Samsung Electronics Co., Ltd., Suwon-si, Gyeonggi-do (KR)

(72) Inventors: Dharmendar Reddy Palle, Austin, TX (US); Jorge A. Kittl, Austin, TX (US); Mark S. Rodder, Dallas, TX (US)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 15/340,827

(22) Filed: Nov. 1, 2016

Related U.S. Application Data

(60) Provisional application No. 62/308,764, filed on Mar. 15, 2016.

(51) Int. Cl.

| | |
|---|---|
| *H01L 27/12* | (2006.01) |
| *H01L 29/66* | (2006.01) |
| *H01L 29/06* | (2006.01) |
| *H01L 29/423* | (2006.01) |
| *H01L 29/786* | (2006.01) |
| *H01L 29/167* | (2006.01) |

(52) U.S. Cl.
CPC .... *H01L 29/66553* (2013.01); *H01L 29/0673* (2013.01); *H01L 29/167* (2013.01); *H01L 29/42392* (2013.01); *H01L 29/66545* (2013.01); *H01L 29/66742* (2013.01); *H01L 29/78618* (2013.01); *H01L 29/78696* (2013.01)

(58) Field of Classification Search
CPC .......... H01L 29/66553; H01L 29/0673; H01L 29/167; H01L 29/42392; H01L 29/66545; H01L 29/66742; H01L 29/78618; H01L 29/78696
USPC ........................................................ 257/347
See application file for complete search history.

(56) References Cited

U.S. PATENT DOCUMENTS

| | | | |
|---|---|---|---|
| 7,897,493 B2 | 3/2011 | Fiorenza et al. |
| 8,207,523 B2 | 6/2012 | Tsai et al. |
| 8,394,687 B2 | 3/2013 | Ranade et al. |
| 8,420,464 B2 | 4/2013 | Basker et al. |
| 8,686,511 B2 | 4/2014 | Ranade et al. |

(Continued)

FOREIGN PATENT DOCUMENTS

WO WO 2015/099782 A1 7/2015

*Primary Examiner* — Tu-Tu Ho
(74) *Attorney, Agent, or Firm* — Lewis Roca Rothgerber Christie LLP

(57) ABSTRACT

A method of forming a horizontal nanosheet device or a horizontal nanowire device includes forming a dummy gate and a series of external spacers on a stack including an alternating arrangement of sacrificial layers and channel layers, deep etching portions of the stack between the external spacers to form electrode recesses for a source electrode and a drain electrode, performing an etch-back on portions of the sacrificial layers to form internal spacer recesses above and below each of the channel layers, forming doped internal spacers in the internal spacer recesses, and forming doped extension regions of the source electrode and the drain electrode by outdiffusion of dopants from the doped internal spacers. The method may also include epitaxially regrowing the source electrode and the drain electrode in the electrode recesses.

20 Claims, 7 Drawing Sheets

(56) References Cited

U.S. PATENT DOCUMENTS

| | | | |
|---|---|---|---|
| 9,583,487 B2 * | 2/2017 | Giles | .................... H01L 29/785 |
| 2007/0293056 A1 | 12/2007 | Setsuhara et al. | |

* cited by examiner

NANOSHEET AND NANOWIRE DEVICES HAVING DOPED INTERNAL SPACERS AND METHODS OF MANUFACTURING THE SAME

CROSS-REFERENCE TO RELATED APPLICATION

The present application claims priority to and the benefit of U.S. Provisional Application No. 62/308,764 entitled "Improved Extension Doping for NS or NW Devices Using Doped Internal Spacers," filed on Mar. 15, 2016 in the U.S. Patent and Trademark Office, the entire contents of which are incorporated herein by reference.

BACKGROUND

In related art horizontal nanosheet (hNS) devices, extension regions of the source and drain electrodes are doped by diffusion from the source and drain electrodes. However, it is difficult to achieve abrupt junctions by diffusion from the source and drain electrodes and there is a tradeoff between the parasitic resistance of the device and the abruptness of the junctions. Additionally, it is difficult to scale with this method because the dopants travel across the width of the internal spacers. Moreover, doping the extension regions from the source and drain electrodes does not self-align the extension regions with the gate stack of the device.

In related art FinFET devices, doped external spacers may be used to dope the extension regions of the source and drain electrodes. However, doping the extension regions by diffusion from external spacers requires the dopants to travel a relatively large distance to reach the middle of the horizontal nanosheet, which results in non-uniform doping across the width of the extension regions. Additionally, in the formation of related art FinFET devices, the materials used as diffusion sources are typically not adequate as spacer material because they are not etch resistant and therefore are not compatible with self-aligned contact (SAC) processes. Accordingly, in the formation of related art FinFET devices, the external spacers used to dope the extension regions are replaced by external spacers having a different, more robust (e.g., etch-resistant) material compatible following the doping of the extension regions with the sacrificial external spacers.

SUMMARY

The present disclosure is directed to various methods of manufacturing a horizontal nanosheet (hNS) or horizontal nanowire (hNW) device. In one embodiment, the method includes forming a dummy gate and a series of external spacers on a stack including an alternating arrangement of sacrificial layers and channel layers, deep etching portions of the stack between the external spacers to form electrode recesses for a source electrode and a drain electrode, performing an etch-back on portions of the sacrificial layers to form internal spacer recesses above and below each of the channel layers, forming doped internal spacers in the internal spacer recesses, forming doped extension regions of the source electrode and the drain electrode by outdiffusion of dopants from the doped internal spacers. The method may also include epitaxially regrowing the source electrode and the drain electrode in the electrode recesses. Epitaxially regrowing the source electrode and the drain electrode may be performed before or after forming the doped extension regions of the source electrode and the drain electrode. The method may also include etching remaining portions of the sacrificial layers to form cavities and depositing gate stacks in the cavities, wherein forming the doped extension regions self-aligns the doped extension regions of the source and drain electrodes with the gate stacks. The forming of the doped extension regions may be performed before or after the epitaxially regrowing of the source electrode and the drain electrode. As least a portion of at least one of the doped internal spacers may include a doped insulator.

Forming each doped internal spacer of the doped internal spacers may include forming a first doped internal spacer comprising a first insulating material having a first concentration of dopants, etching a portion of the first doped internal spacer to form a recess in the first doped internal spacer, and forming a second doped internal spacer in the recess. The second doped internal spacer includes a second insulating material having a second concentration of dopants different than the first concentration of dopants. The first concentration of dopants may be less than the second concentration of dopants. The first insulating material may be the same as the second insulating material or different than the second insulating material. The horizontal nanosheet device may be an nMOS device and the doped internal spacers may include n-type dopants such as P, As, and/or Sb. The doped internal spacers may include a doped oxide such as phosphosilicate glass. The horizontal nanosheet device may be a pMOS device and the doped internal spacers may include p-type dopants such as B, Al, and/or Ga. The doped internal spacers may include a doped oxide such as borosilicate glass.

The present disclosure is also directed to various embodiments of a horizontal nanosheet or horizontal nanowire device. In one embodiment, the device may include a source electrode, a drain electrode, a gate stack between the source electrode and the drain electrode, a first doped internal spacer separating the source electrode from the gate stack, a second doped internal spacer separating the drain electrode from the gate stack, and a channel region under the gate stack extending between the source electrode and the drain electrode. The source electrode and the drain electrode each include a doped extension region. The doped extension region of the source electrode is under at least a portion of the first doped spacer and the doped extension region of the drain electrode is under at least a portion of the second doped spacer, and the doped extension regions of the source and drain electrodes are aligned with the gate stack. The device may also include a third doped spacer under the extension region of the source electrode and a fourth doped spacer under the extension region of the drain electrode. At least one of the first doped internal spacer or the second doped internal spacer may include a first region having a first concentration of dopants and a second region having a second concentration of dopants different than the first concentration of dopants. The first and second doped internal spacers may be etch resistant, non-sacrificial spacers. The first and second doped internal spacers may be doped with n-type dopants such as P, As, and/or Sb, or p-type dopants such as B, Al, and/or Ga.

This summary is provided to introduce a selection of features and concepts of embodiments of the present disclosure that are further described below in the detailed description. This summary is not intended to identify key or essential features of the claimed subject matter, nor is it intended to be used in limiting the scope of the claimed subject matter. One or more of the described features may be combined with one or more other described features to provide a workable device.

BRIEF DESCRIPTION OF THE DRAWINGS

These and other features and advantages of embodiments of the present disclosure will become more apparent by reference to the following detailed description when considered in conjunction with the following drawings. In the drawings, like reference numerals are used throughout the figures to reference like features and components. The figures are not necessarily drawn to scale.

DETAILED DESCRIPTION

Figure 1:
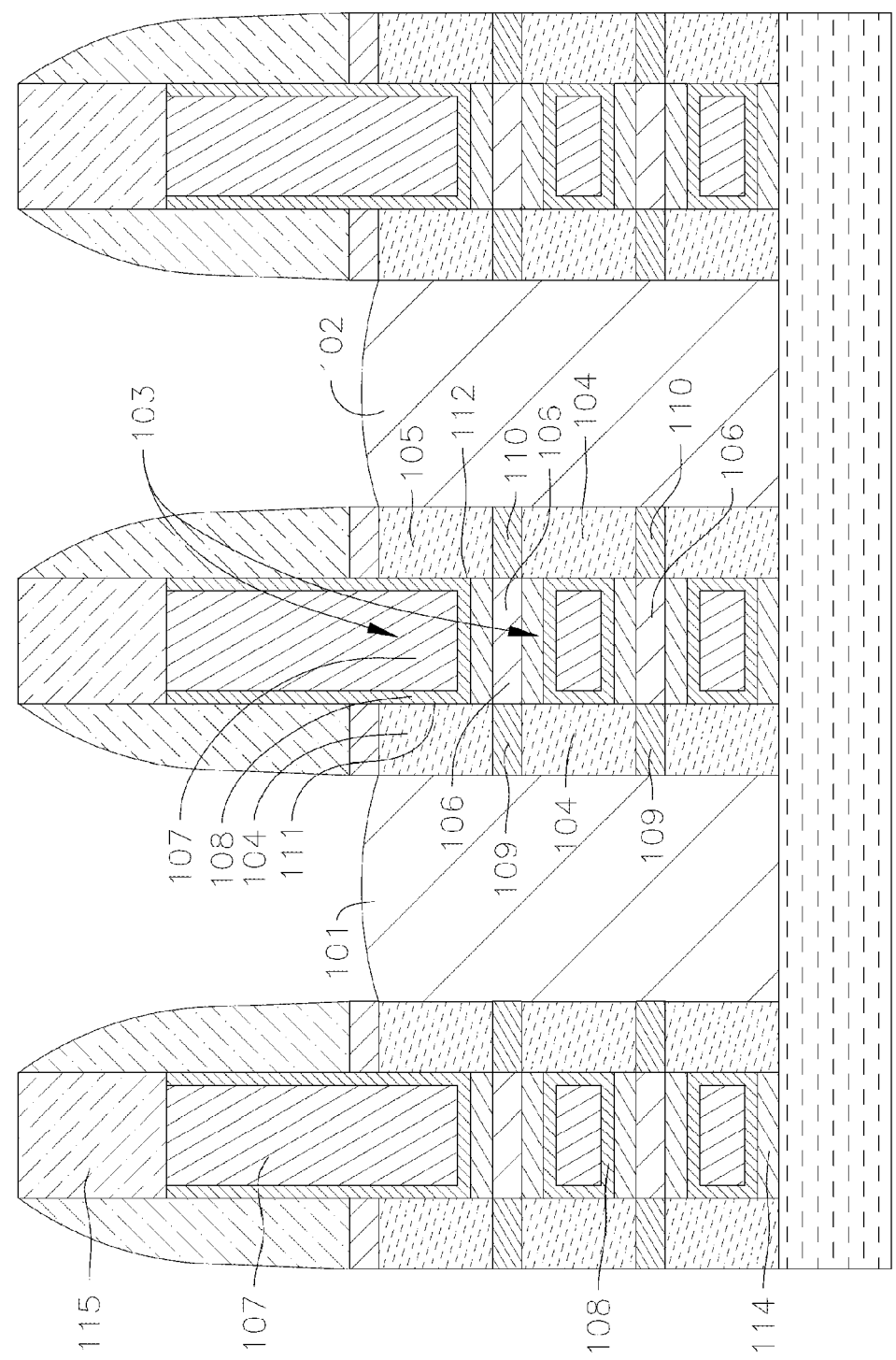
FIG. 1 is a schematic cross-sectional view of a nanosheet (NS) or nanowire (NW) device according to one embodiment of the present disclosure.

The present disclosure is directed to various embodiments of a horizontal nanosheet (hNS) or a horizontal nanowire (hNW) device (e.g., an nMOS device or a pMOS device) having doped internal spacers and methods of manufacturing the same. According to various embodiments of the present disclosure, the doped internal spacers are utilized to form doped extension regions of source and drain electrodes of the hNS or hNW device. Utilizing the doped internal spacers to form the doped extension regions of the source and drain electrodes self-aligns the doped extension regions to the gate stack of the hNS or hNW device. Self-alignment of the doped extension regions to the gate stack promotes a well-behaved and controlled hNS or hNW device. Otherwise, hNS or hNW devices formed without self-alignment of the extension regions will have varying degrees of misalignment with the gate stack, which may result in widely different device characteristics (e.g., different Ion–Ioff).

Additionally, utilizing the doped internal spacers to form the doped extension regions of the source and drain electrodes reduces the diffusion distance compared to related art hNS or hNW devices in which the doped extensions are laterally diffused from the source and drain electrodes. This shorter diffusion distance increases (i.e., improves) junction abruptness and better junction abruptness allows for better control of short channel effects, which is important for scaling and increased performance of scaled devices (e.g., higher performance at fixed Ioff). Utilizing the doped internal spacers as the source of the dopants is also configured to produce uniformly or substantially uniformly doped extension regions.

Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

With reference now to FIG. 1, a horizontal nanosheet (hNS) or horizontal nanowire (hNW) device 100 (e.g., an nMOS device or a pMOS device) according to one embodiment of the present disclosure includes a source electrode 101, a drain electrode 102, a series of gate stacks 103 between the source electrode 101 and the drain electrode 102, a series of first doped internal spacers 104 between the source electrode 101 and the gate stacks 103, a series of second doped internal spacers 105 between the drain electrode 102 and the gate stacks 103, and a series of channel regions 106 under the gate stacks 103 and extending between the source electrode 101 and the drain electrode 102. In the illustrated embodiment, each of the gate stacks 103 may include a metal gate electrode 107, a high-k dielectric layer 108, an interfacial layer 114, and may include a capping layer 115 such as a nitride (which is removed in the regions where the gates are contacted).

With continued reference to the embodiment illustrated in FIG. 1, the source electrode 101 includes at least one doped extension region 109 and the drain electrode 102 includes at least one doped extension region 110. In the illustrated embodiment, the source electrode 101 and the drain electrode 102 each include two doped extension regions 109, 110, although in one or more embodiments, the source and drain electrodes 101, 102 of the hNS or hNW device 100 may each include any other suitable number of doped extension regions 109, 110. Additionally, in the illustrated embodiment, each of the doped extension regions 109 of the source electrode 101 extends between two of the first doped internal spacers 104 and each of the doped extension regions 110 of the drain electrode 102 extends between two of the second doped internal spacers 105. Accordingly, for each doped extension region 109 of the source electrode 101, one of the first doped internal spacers 104 is above (e.g., on) the doped extension region 109 and another one of the first doped internal spacers 104 is below (e.g., underneath) the doped extension region 109, and for each doped extension region 110 of the drain electrode 102, one of the second doped internal spacers 105 is above (e.g., on) the doped extension region 110 and another one of the second doped internal spacers 105 is below (e.g., underneath) the doped extension region 110 (e.g., each of the doped extension regions 109 of the source electrode 101 extends between a pair of first doped internal spacers 104 and each of the doped extension regions 110 of the drain electrode 102 extends between a pair of second doped internal spacers 105). In the illustrated embodiment, the doped extension regions 109, 110 are aligned with inner edges 111, 112 of the first and second doped internal spacers 104, 105, respectively (e.g., the doped extension regions 109, 110 are aligned with the gate stacks 103). Additionally, in the illustrated embodiment, the doped extension regions 109, 110 of the source and drain electrodes 101, 102 are uniformly or substantially uniformly doped. Additionally, in the illustrated embodiment, the first and second doped internal spacers 104, 105 are non-sacrificial (e.g., etch-resistant).

The doped extension regions 109, 110 of the source and drain electrodes 101, 102 may have any suitable thickness, such as, for instance, from approximately 3 nm to approximately 7 nm. In one or more embodiments, the doped extension regions 109, 110 may have each have a thickness of approximately 5 nm.

In one or more embodiments in which the hNS or hNW device 100 is a pMOS device, the doped internal spacers 104, 105 may include p-type dopants, such as, for example, B, Al, Ga, or combinations thereof. In one or more embodiments in which the hNS or hNW device 100 is a pMOS device, the doped internal spacers 104, 105 may include a doped oxide, such as, for example, borosilicate glass (BSG). In one or more embodiments in which the hNS or hNW device 100 is an nMOS device, the doped internal spacers 104, 105 may include n-type dopants, such as, for example, P, As, Sb, or combinations thereof. In one or more embodiments in which the hNS or hNW device 100 is an nMOS device, the doped internal spacers 104, 105 may include a doped oxide, such as, for example phosphosilicate glass (PSG). In one or more embodiments, the material of the doped internal spacers 104, 105 may be selected such that the doped internal spacers 104, 105 are etch resistant or substantially etch resistant. For example, the material of the doped internal spacers 104, 105 may be selected such that the doped internal spacers 104, 105 are resistant or substantially resistant to an etch performed during a process of manufacturing the hNS or hNW device 100 (e.g., sacrificial layers may be selectively etched without or substantially without etching the doped internal spacers 104, 105 during a replacement metal gate (RMG) process for forming the gate stacks 103). In one or more embodiments, for example, the doped internal spacers 104, 105 may include carbon to provide etch selectivity. Additionally, in one or more embodiments, an entirety or substantially an entirety of each of the doped internal spacers 104, 105 may be a doped insulator. In one or more embodiments, at least a portion of each of the doped internal spacers 104, 105 may be a doped insulator.

Figure 2:
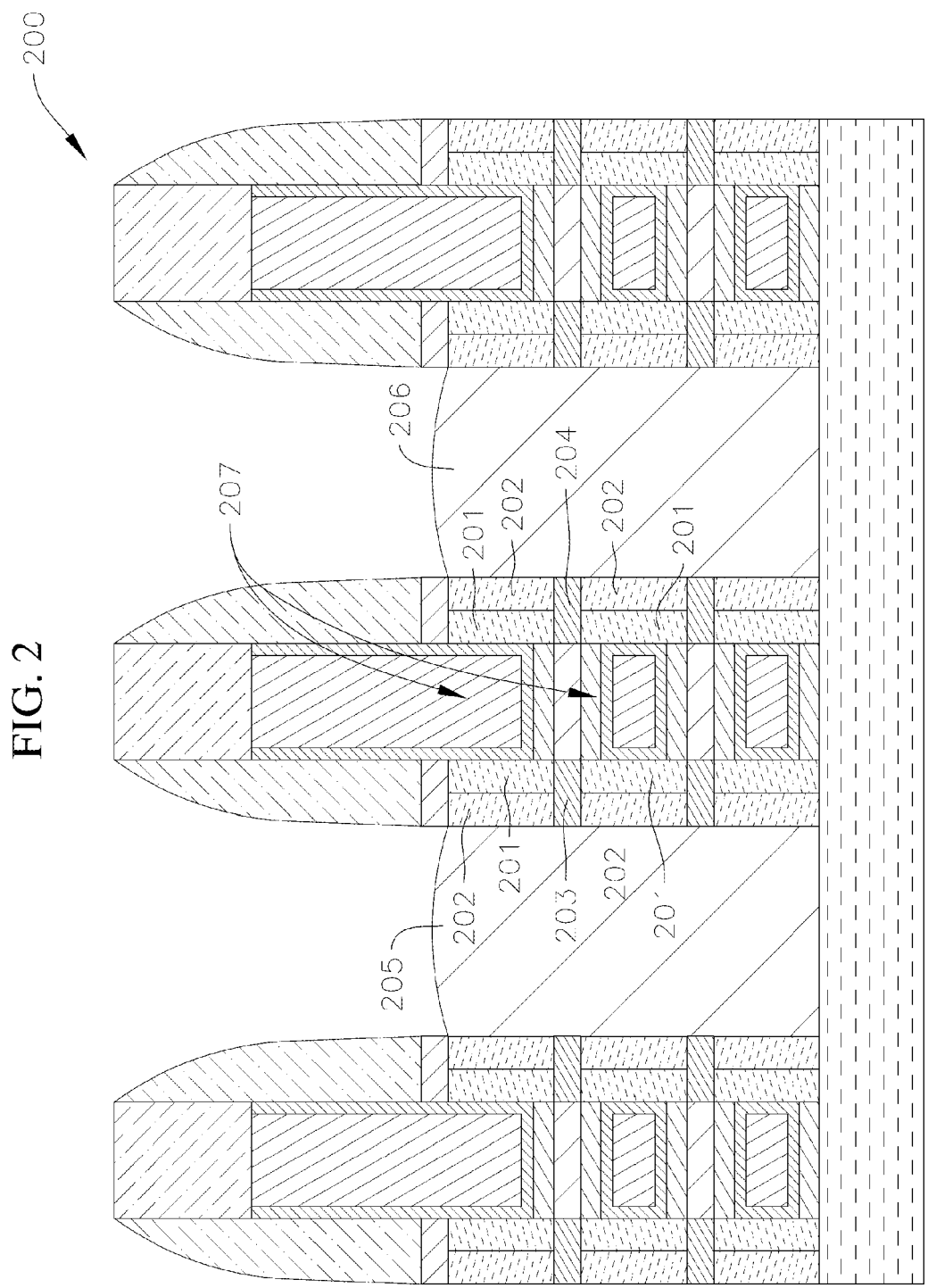
FIG. 2 is a schematic cross-sectional view of a nanosheet (NS) or nanowire (NW) device according to another embodiment of the present disclosure.

Although in the illustrated embodiment of the hNS or hNW device 100 each of the doped extension regions 109, 110 includes a single doped internal spacer 104, 105 above the doped extension region 109, 110 and a single doped internal spacer 104, 105 below the doped extension region 109, 110, in one or more embodiments, the hNS or hNW device 100 may include any other suitable number of doped internal spacers 104, 105 above and below each of the doped extension regions 109, 110 (e.g., the hNS or hNW device 100 may include two or more doped internal spacers above and below each of the doped extension regions 109, 110). For instance, in the embodiment illustrated in FIG. 2, a hNS or hNW device 200 according to another embodiment of the present disclosure includes a pair of doped internal spacers 201, 202 above each doped extension region 203, 204 of a source electrode 205 and a drain electrode 206, respectively, and a pair of doped internal spacers 201, 202 below each doped extension region 203, 204. In the illustrated embodiment, the doped internal spacers 201, 202 of each pair of doped internal spacers are adjacent to each other (e.g., the doped internal spacers 201, 202 of each pair abut each other). In the illustrated embodiment, each pair includes a first doped internal spacer 201 proximate to a gate stack 207 and a second doped internal spacer 202 proximate to the source or drain electrode 205, 206. In one or more embodiments, the first doped internal spacer 201 of each pair of doped internal spacers may have a first concentration of dopants and the second doped internal spacer 202 may have a second concentration of dopants different than the first concentration of dopants. In one or more embodiments, the first concentration of dopants in the first doped internal spacers 201 is less than the second concentration of dopants in the second doped internal spacers 202. In one or more embodiments, a material of the first doped internal spacers 201 may be the same as the material of the second doped internal spacers 202, although in one or more embodiments, the material of the first doped internal spacers 201 may be different than a material of the second doped internal spacers 202.

In one or more embodiments, the first doped internal spacers 201 may have a different k-value than the k-value of the second doped internal spacers 202 (e.g., the first doped internal spacers 201 may have a relatively higher k-value and the second doped internal spacers 202 may have a relatively lower k-value). In general, low-k materials are typically better for lower capacitance and higher performance, but low-k may be less robust and/or have relatively more reliability problems than relatively higher-k materials. In one or more embodiments, a combination of a relatively low-k material and a relatively high-k material for the doped internal spacers may perform better than doped internal spacers including only a relatively low-k material or a relatively high-k material.

Additionally, in one or more embodiments, the first internal spacers 201 may be more robust (e.g., more etch-resistant) than the second internal spacers 202. Accordingly, in one or more embodiments, the first internal spacers 201 may be more resistant to an etch performed during a task of manufacturing the hNS or hNW device 202, as described in detail below with reference to FIGS. 3A-3H (e.g., the first doped internal spacers 201 may be more resistant to the etch performed to remove sacrificial material in a replacement metal gate (RMG) process of forming the gate stacks 207).

Figure 3A:
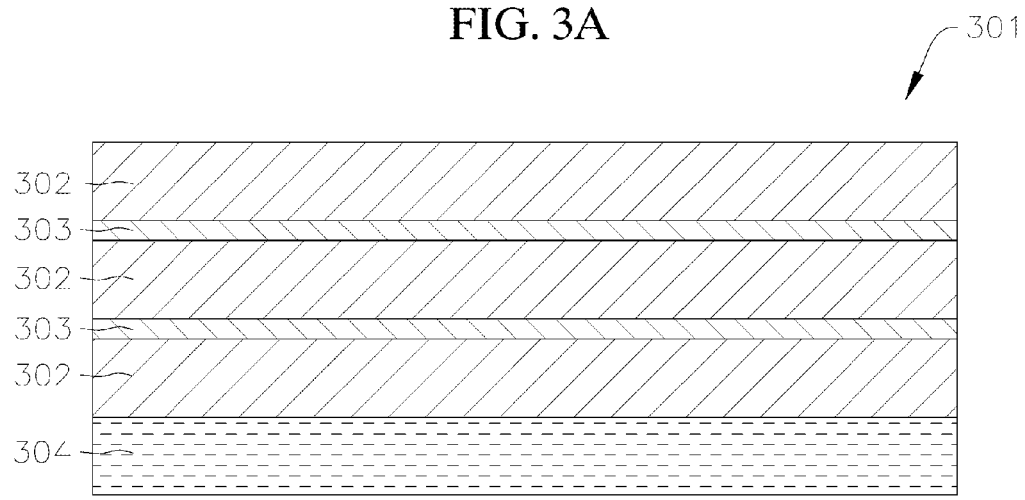
FIGS. 3A-3H depict tasks of a method of forming a NS or NW device according to one embodiment of the present disclosure.

FIGS. 3A-3H depict tasks of a method of forming a horizontal nanosheet (hNS) or horizontal nanowire (hNW) device 300 according to one embodiment of the present disclosure. As illustrated in FIG. 3A, the method of forming the NS or NW device 300 according to one embodiment includes forming or obtaining an initial stack 301. In one or more embodiments, the initial stack 301 may be grown from a strain relaxation buffer (SRB). In one or more embodiments, the initial stack 301 may be transferred to an OI wafer using any suitable transfer process known in the art. In the illustrated embodiment, the initial stack 301 includes an alternating arrangement of sacrificial layers 302 and channel layers 303. In one or more embodiments in which the hNS or hNW device 300 is an nMOS device, the channel layers 303 may be Si and the sacrificial layers 302 may be SiGe. In one or more embodiments in which the hNS or hNW device 300 is a pMOS device, the channel layers 303 may be Si and the sacrificial layers 302 may be SiGe. In one or more embodiments in which the hNS or hNW device 300 is a pMOS device, the channel layers 303 may be SiGe or Ge and the sacrificial layers 302 may be Si or SiGe having a lower content of Ge than the channel layers 303. Although in the illustrated embodiment the initial stack 301 includes three sacrificial layers 302 and two channel layers 303, in one or more embodiments, the initial stack 301 may include any other suitable number of sacrificial layers 302 and channel layers 303 depending on the desired structure of the hNS or hNW device 300. Additionally, in one embodiment, the lowermost sacrificial layer 302 of the initial stack 301 may be formed on any suitable isolation 304 known in the art.

Figure 3B:
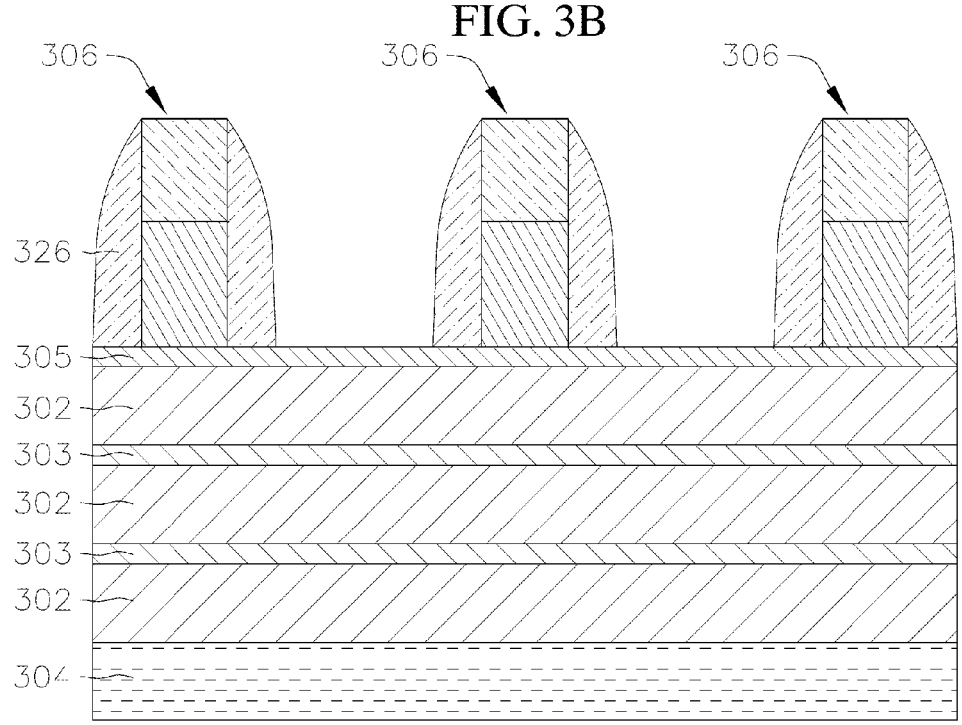

With reference now to FIG. 3B, the method of forming the hNS or hNW device 300 according to one embodiment of the present disclosure includes a task of patterning the stack 301 to define the hNS or hNW widths (in direction normal to the plane of FIG. 3B), as known in related art hNS or hNW fabrication processes, and forming a dummy gate structure including a dummy gate oxide layer 305, dummy gate electrodes 306 (illustrated as a bi-layer in FIG. 3B, which may include a bottom amorphous or poy-Si layer and a top dielectric layer such as a nitride), and a series of external spacers 326 on the patterned stack 301. The dummy gate electrodes 306, the external spacers 326, and the dummy gate oxide layer 305 may be formed by any manufacturing technique or process known in the art or hereinafter developed.

Figure 3C:
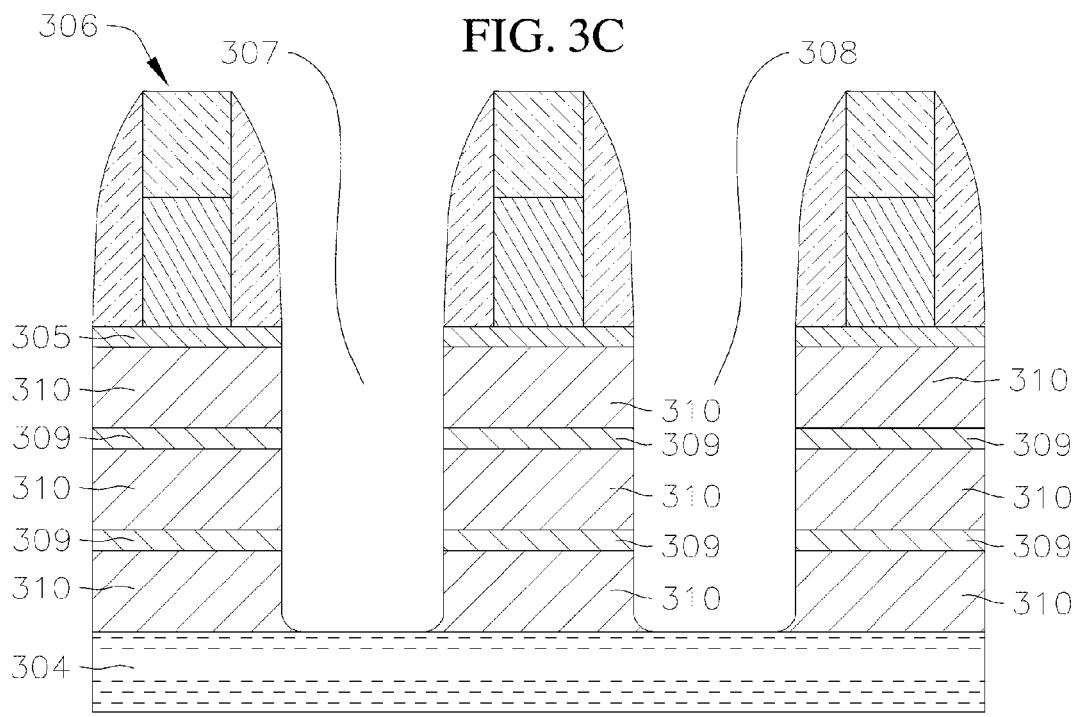

With reference now to FIG. 3C, the method of forming the hNS or hNW device 300 according to one embodiment of the present disclosure includes a task of deep etching portions of the patterned stack 301 (e.g., etching to remove portions of the sacrificial layers 302 and channel layers 303) to form recesses 307, 308 for a source electrode and a drain electrode, respectively. In the illustrated embodiment, the portions of the stack 301 that are etched away are located between the external spacers 326 deposited on top of the patterned stack 301, as described above with reference to the task depicted in FIG. 3B. Following the task of deep etching the stack 301, the channel layers 303 are separated into channel regions 309 and the sacrificial layers 302 are separated into sacrificial regions 310 above and below the channel regions 309 (i.e., following the deep etch, the stack includes an alternating arrangement of channel regions 309 and sacrificial regions 310 aligned with the channel regions 309). Although in the illustrated embodiment the deep etch is performed through the lowermost sacrificial layer 302 without etching or substantially without etching the substrate 304, in one or more embodiments the deep etch may be performed to slightly different depths, such as also etching a small portion of the substrate 304.

Figure 3D:
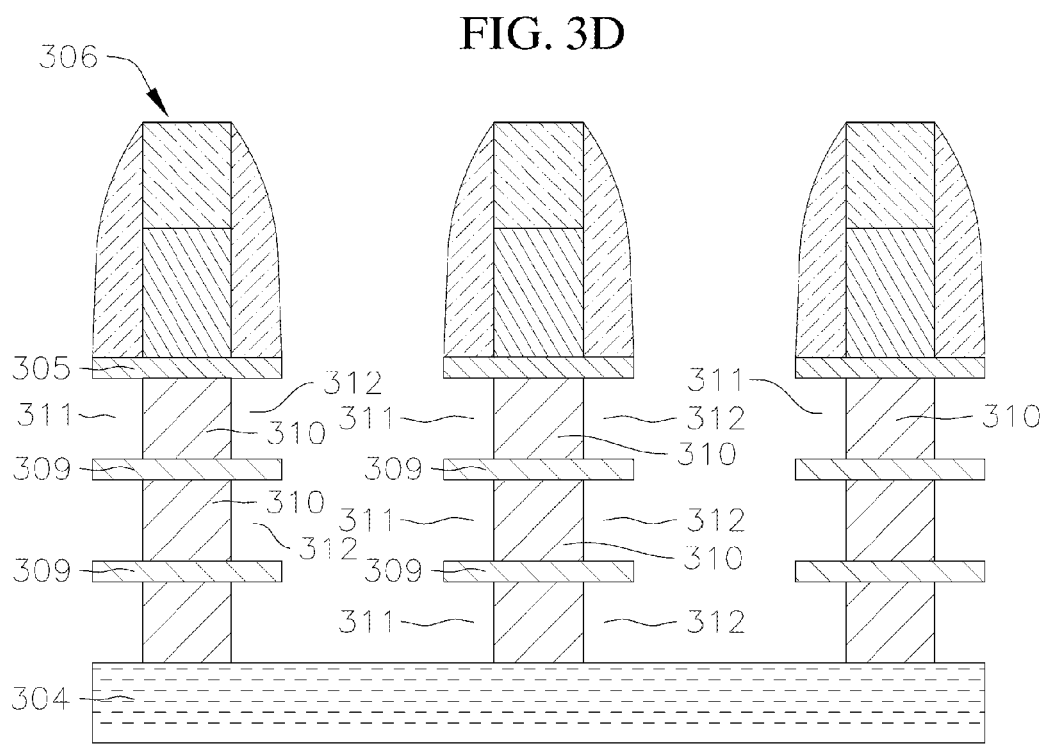

With reference now to FIG. 3D, the method of forming the hNS or hNW device 300 according to one embodiment of the present disclosure includes a task of laterally etching opposite ends of each of the sacrificial regions 310 to form recesses 311, 312 for doped internal spacers (i.e., performing an etch-back of each of the sacrificial regions 310, selectively with respect to the channel regions 309). During the task of etching, opposite ends of the sacrificial regions 310 are removed laterally, but the channel regions 309 remain substantially intact. Accordingly, following the task of etching the sacrificial regions 310 to form the recesses 311, 312 for the doped internal spacers, the channel regions 309 extend beyond (e.g., overhang) the sacrificial regions 310. The sacrificial regions 310 may be recessed to any suitable depth depending on the desired thickness of the doped internal spacers. For example, in one or more embodiments, the opposite ends of the sacrificial regions 310 may each be recessed by approximately 1 nm to approximately 10 nm to accommodate doped internal spacers having a thickness from approximately 1 nm to approximately 10 nm. The length or depth of the internal spacer recesses 311,312, is also designed to accommodate the appropriate gate length targeted for the hNS or hNW device 300, which is related to the length of the remaining sacrificial regions 310.

Figure 3E:
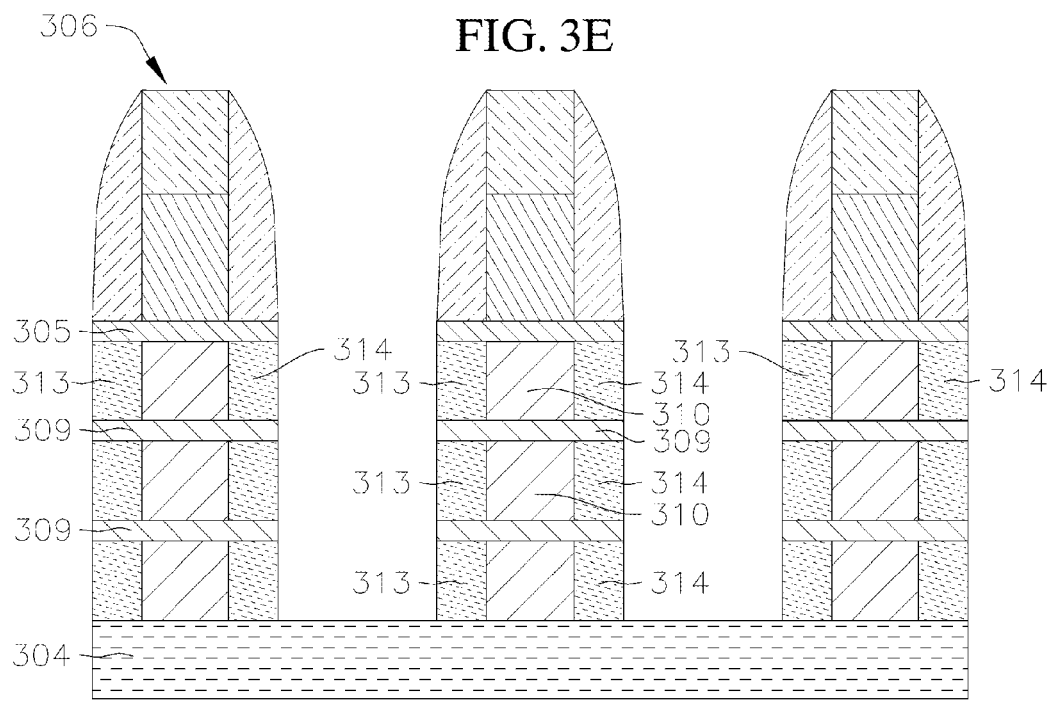

With reference now to FIG. 3E, the method of forming the hNS or hNW device 300 according to one embodiment of the present disclosure includes a task of forming doped internal spacers 313, 314 in the recesses 311, 312, respectively. In one or more embodiments in which the hNS or hNW device 300 is a pMOS device, the doped internal spacers 313, 314 may include p-type dopants, such as, for example, boron (B), aluminum (Al), gallium (Ga), or combinations thereof. In one or more embodiments in which the hNS or hNW device 300 is a pMOS device, the doped internal spacers 313, 314 may include a doped oxide, such as, for example, borosilicate glass (BSG). In one or more embodiments in which the hNS or NW device 300 is an nMOS device, the doped internal spacers 313, 314 may include n-type dopants, such as, for example, phosphorus (P), arsenic (As), antimony (Sb), or combinations thereof. In one or more embodiments in which the hNS or hNW device 300 is an nMOS device, the internal spacers 313, 314 may include a doped oxide, such as, for example phosphosilicate glass (PSG). In one or more embodiments, the material of the doped internal spacers 313, 314 may be selected such that the sacrificial regions 310 may be selectively etched without or substantially without etching the doped internal spacers 313, 314, such as, for instance, during a subsequent replacement metal gate (RMG) process. For example, in one or more embodiments, the doped internal spacers 313, 314 may include carbon to provide etch selectivity. Additionally, in one or more embodiments, an entirety or substantially an entirety of each of the doped internal spacers 313, 314 may be a doped insulator. In one or more embodiments, at least a portion of each of the doped internal spacers 313, 314 may be a doped insulator. The task of forming the doped internal spacers 313, 314 may be performed by any suitable manufacturing technique or process, such as, for instance, a conformal deposition of the spacer material followed by an anisotropic etch. The conformal deposition of the spacer material may be performed, for example, by chemical vapor deposition (CVD) or atomic layer deposition (ALD). In one or more embodiments, the task of forming the doped internal spacers 313, 314 may include the deposition of the spacer material utilizing any other suitable conformal film deposition process. For example, in one or more embodiments in which CVD of silane ($SiH_4$) is utilized to deposit the doped internal spacer material, the spacer material may be doped with phosphorus (P) by adding phosphine ($PH_3$) and/or doped with boron (B) by adding diborane ($B_2H_6$). In one or more embodiments in which tetraethylorthosilicate (TEOS) or tetraethoxysilane is utilized to form the doped internal spacers 313, 314, triethylborate (TEB) and/or trimethylborate (TMB) may be used to dope with boron, and trimethylphosphate (TMPO) and/or trimethylphosphite (TMPI) may be used to dope with phosphorus.

Although in the illustrated embodiment the method includes forming a single doped internal spacer 313, 314 in each recess 311, 312, in one or more embodiments, the method may include one or more tasks of forming two or more doped internal spacers in each recess 311, 312. For instance, in one or more embodiments, the method may include a task of forming a first doped internal spacer having a first concentration of dopants in each of the recesses 311, 312 followed by a task of forming a second doped internal spacer having a second concentration of dopants different than the first concentration of dopants in each of the recesses 311, 312. In one or more embodiments, the first concentration of dopants in the first doped internal spacer is less than the second concentration of dopants in the second doped internal spacer. In one or more embodiments, the task of forming the doped internal spacers 313, 314 may include forming a set of first doped internal spacers in the recesses 311, 312, etching a portion of each of the first doped internal spacers selectively with respect to the channel layers to form a recess in each of the first doped internal spacers, and forming a set of second doped internal spacers in the recesses formed by etching the first doped internal spacers. In one or more embodiments, a material of the first doped internal spacers may be the same as the material of the second doped internal spacers, although in one or more embodiments, the material of the first doped internal spacers may be different than a material of the second doped internal spacers.

In one or more embodiments, the first doped internal spacers may have a different k-value than the k-value of the second doped internal spacers (e.g., the first doped internal spacers may have a relatively higher k-value and the second doped internal spacers may have a relatively lower k-value). In general, low-k materials are typically better for lower capacitance and higher performance, but low-k may be less robust and/or have relatively more reliability problems than relatively higher-k materials. In one or more embodiments, a combination of a relatively low-k material and a relatively high-k material for the doped internal spacers may perform better than doped internal spacers including only a relatively low-k material or a relatively high-k material.

Additionally, in one or more embodiments, the first internal spacers may be more robust (e.g., more etch-resistant) than the second internal spacers. Accordingly, in one or more embodiments, the first internal spacers may be more resistant to a subsequent task of etching the sacrificial regions to form cavities for the gate stacks, described below with reference to FIG. 3H.

Figure 3F:
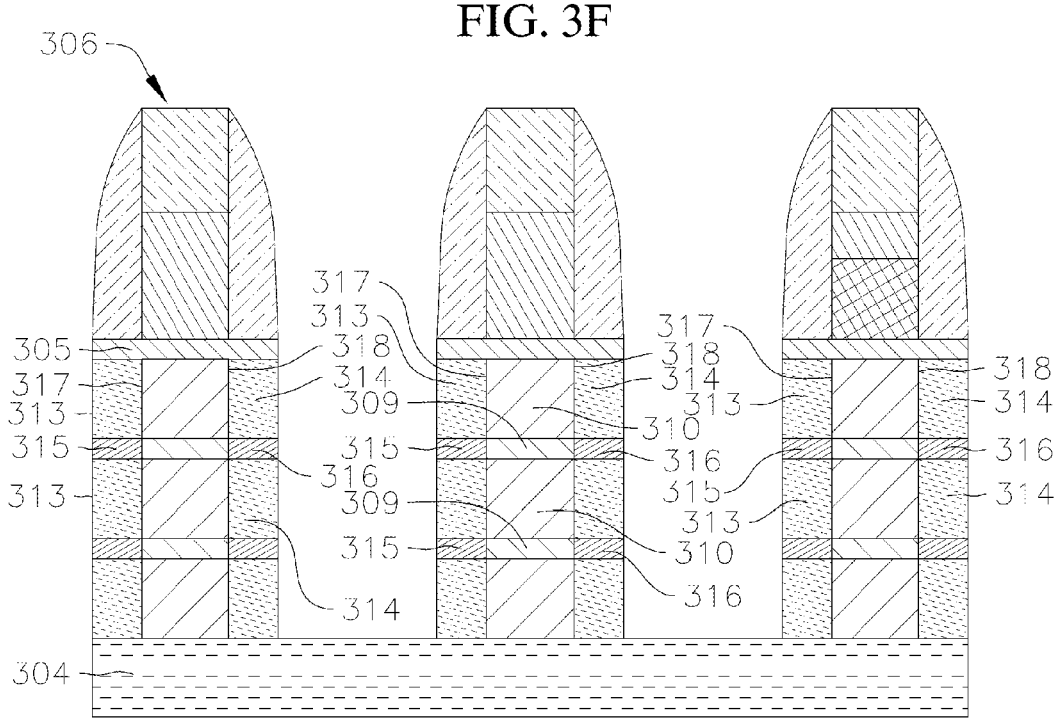

With reference now to FIG. 3F, the method of forming the hNS or hNW device 300 according to one embodiment of the present disclosure includes a task of forming the doped extension regions 315, 316 of the source and drain electrodes, respectively, by out-diffusion of dopants from the doped internal spacers 313, 314 into portions of the channel regions 309 between the doped internal spacers 313, 314. In one or more embodiments, a thermal budget is applied by which dopants diffuse from the doped internal spacers 313, 314 to the portions of the channel regions 309 between the doped internal spacers 313, 314. In one or more embodiments, the task of forming the doped extension regions 315, 316 by out-diffusion from the doped internal spacers 313, 314 includes using spike anneals and/or milli-second (ms) anneals, such as, for instance, flash anneals or ms-laser anneals. In the illustrated embodiment, each extension region 315, 316 of the source and drain electrodes is doped by a doped internal spacer 313, 314 above the extension region and a doped internal spacer 313, 314 below the extension region (e.g., the extension regions 315 of the source electrode are each doped by a pair of doped internal spacers 313 above and below the extension region 315, and the extension regions 316 of the drain electrode are each doped by a pair of doped internal spacers 314 above and below the extension region 316). Doping the extension regions 315, 316 from above and below reduces the diffusion distance compared to related art hNS or hNW devices in which the doped extensions are diffused. This shorter diffusion distance increases (improves) junction abruptness (i.e. results in more abrupt junctions). In one or more embodiments in which the extension regions 315, 316 are doped by outdiffusion from the doped internal spacers 313, 314 above and below the extension regions 315, 316, the diffusion distance is half the thickness of the horizontal nanosheet (e.g., half the thickness of the respective channel region 309). In one or more embodiments, the thickness of each of the channel regions 309 may be approximately 5 nm or less such that the diffusion distance may be approximately 2.5 nm or less. Additionally, utilizing the doped internal spacers 313, 314 as the source of the dopants is configured to produce uniformly or substantially uniformly doped extension regions 315, 316. Utilizing the doped internal spacers 313, 314 to dope the extension regions 315, 316 of the source and drain electrodes also self-aligns the doped extension regions 315, 316 with inner edges 317, 318 of the doped internal spacers 313, 314, respectively, such that the doped extension regions 315, 316 will be self-aligned with gate stacks (e.g., a metal gate electrode and a interfacial layer) deposited or formed in a subsequent task of the method described below with reference to FIG. 3H.

Figure 3G:
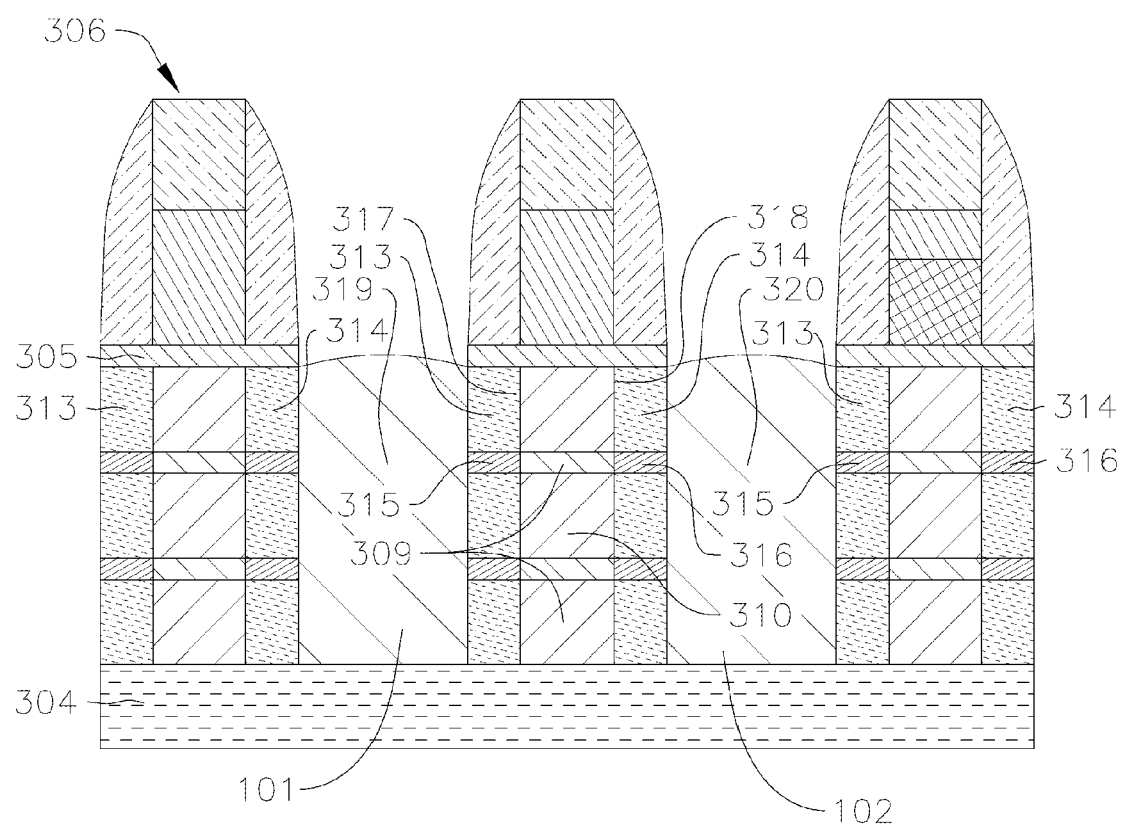

With reference now to FIG. 3G, the method of forming the hNS or hNW device 300 according to one embodiment of the present disclosure includes a task of epitaxially re-growing the source electrode 319 and the drain electrode 320 in the recesses 307, 308, respectively, formed during the task of deep etching portions of the initial stack 301, as described above in reference to FIG. 3C.

Figure 3H:
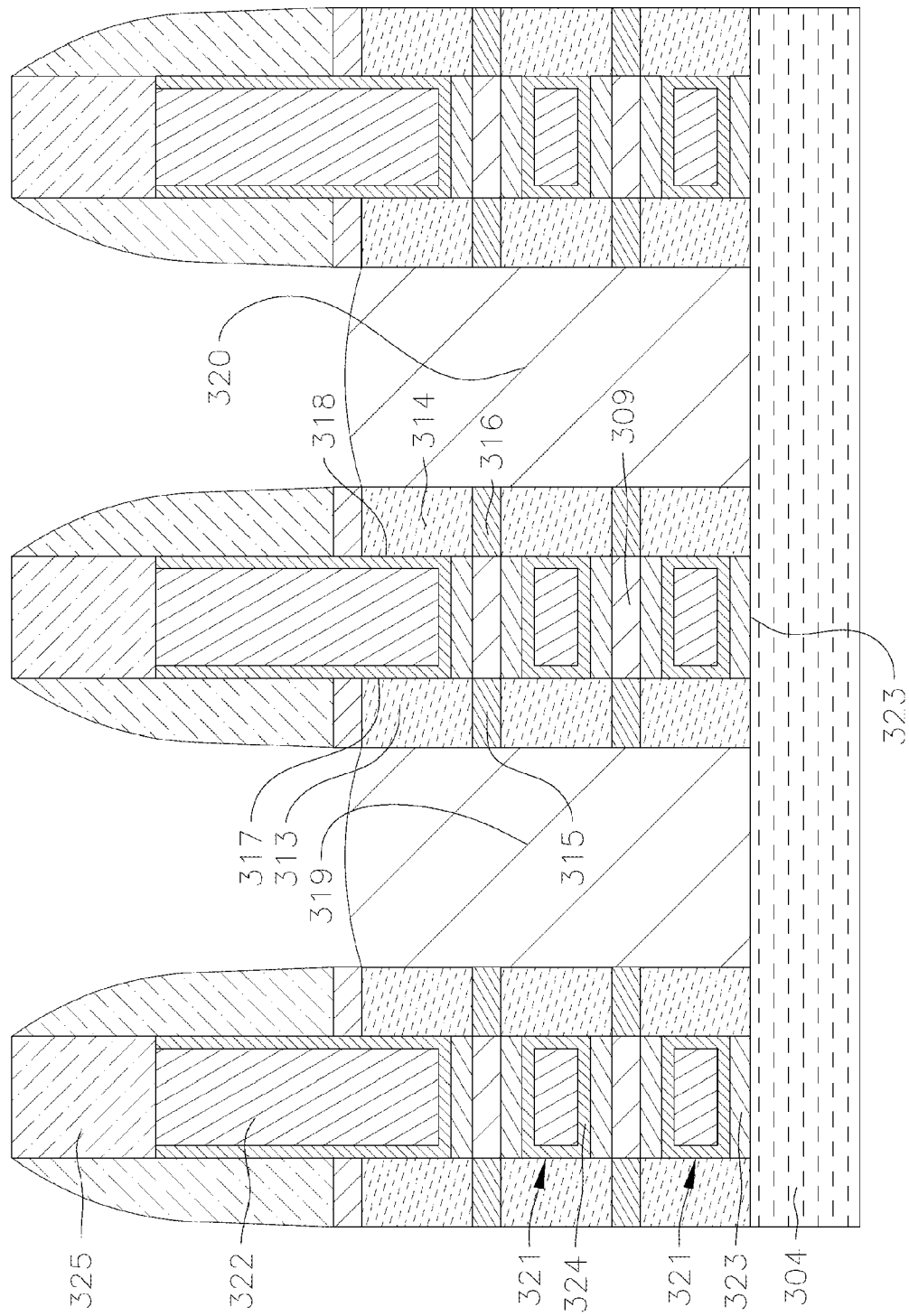

With reference now to FIG. 3H, the method of forming the hNS or hNW device 300 according to one embodiment of the present disclosure includes tasks, known in the related art, of forming and planarizing a dielectric layer such as an oxide, opening a gate cavity by removing the dummy gate electrodes 306 including the dummy gate oxide layer 305 in regions between the external spacers 326, selectively removing the sacrificial regions 310 within the gate cavity (e.g., removing the remainder of each of the sacrificial regions 310 by selective etching), and forming or depositing a gate stack and dielectric (e.g., nitride) capping layers. In one or more embodiments, the gate stack may include interfacial layers in contact with the channel regions 309, high-k dielectric layers, metal layers and dielectric capping layers such as nitride, as described below. The task of selectively etching the sacrificial regions 310 does not affect the doped internal spacers 313, 314 or the channel regions 309. Accordingly, following the task of selectively etching the sacrificial regions 310, the doped internal spacers 313, 314 and the channel regions 309 remain intact.

With continued reference to FIG. 3H, the method of forming the hNS or hNW device 300 according to one embodiment of the present disclosure also includes a task of forming or depositing a gate stack 321 including a metal gate electrode 322, an interfacial layer (IL) 323 in contact with the channel regions 309, and a high-k dielectric layer 324 for each channel region 309. The gate stacks 321 are formed or deposited in regions that were previously occupied by the sacrificial regions 310 extending laterally between the doped internal spacers 313, 314 (i.e., the gate stacks 321 are deposited in cavities that were formed during the task of selectively etching the sacrificial regions 310). The task of forming or depositing the gate stacks 321 may be performed by any suitable replacement metal gate (RMG) process now known or hereinafter developed. In the illustrated embodiment, the gate stacks 321 include dielectric capping layers 325, such as nitrides (which will be removed in subsequent tasks of the fabrication process in the regions where the gates are contacted).

Although in the illustrated embodiment the task of forming the doped extension regions 315, 316 by out-diffusion from the doped internal spacers 313, 314 is performed before the task of epitaxially re-growing the source electrode 319 and the drain electrode 320, in one or more embodiments, the task of forming the doped extension regions 315, 316 may be performed at any other suitable point in the method. For example, in one or more embodiments, the task of forming the doped extension regions 315, 316 by out-diffusion from the doped internal spacers 313, 314 may be performed after the task of epitaxially re-growing the source electrode 319 and the drain electrode 320 or after the task of forming or depositing the gate stacks 321.

What is claimed is:

1. A method of forming a horizontal nanosheet device or a horizontal nanowire device, the method comprising:
   forming a dummy gate and a plurality of external spacers on a stack comprising an alternating arrangement of sacrificial layers and channel layers;
   deep etching portions of the stack between the plurality of external spacers to form electrode recesses for a source electrode and a drain electrode;
   performing an etch-back on portions of the sacrificial layers to form internal spacer recesses above and below each of the channel layers;
   forming doped internal spacers in the internal spacer recesses; and
   forming doped extension regions of the source electrode and the drain electrode by outdiffusion of dopants from the doped internal spacers.

2. The method of claim 1, further comprising epitaxially regrowing the source electrode and the drain electrode in the electrode recesses, wherein the epitaxially regrowing the source electrode and the drain electrode is performed before or after the forming the doped extension regions of the source electrode and the drain electrode.

3. The method of claim 1, further comprising:
   etching remaining portions of the sacrificial layers to form cavities; and
   forming gate stacks in the cavities,
      wherein the forming of the doped extension regions self-aligns the doped extension regions of the source and drain electrodes with the gate stacks.

4. The method of claim 1, wherein at least a portion of at least one of the doped internal spacers comprises a doped insulator.

5. The method of claim 1, wherein forming each doped internal spacer of the doped internal spacers comprises:
   forming a first doped internal spacer comprising a first insulating material having a first concentration of dopants;
   etching a portion of the first doped internal spacer to form a recess in the first doped internal spacer; and
   forming a second doped internal spacer in the recess, the second doped internal spacer comprising a second insulating material having a second concentration of dopants different than the first concentration of dopants.

6. The method of claim 5, wherein the first concentration of dopants is less than the second concentration of dopants.

7. The method of claim 5, wherein the first insulating material is the same as the second insulating material.

8. The method of claim 5, wherein the first insulating material is different than the second insulating material.

9. The method of claim 1, wherein the horizontal nanosheet device is an nMOS device and wherein the doped internal spacers comprise n-type dopants.

10. The method of claim 9, wherein the n-type dopants are selected from the group of dopants consisting of P, As, Sb, and combinations thereof.

11. The method of claim 9, wherein the doped internal spacers comprise a doped oxide.

12. The method of claim 11, wherein the doped oxide is phosphosilicate glass.

13. The method of claim 1, wherein the horizontal nanosheet device is a pMOS device and wherein the doped internal spacers comprise p-type dopants.

14. The method of claim 13, wherein the p-type dopants are selected from the group of dopants consisting of B, Al, Ga, and combinations thereof.

15. The method of claim 13, wherein the doped internal spacers comprise a doped oxide.

16. The method of claim 15, wherein the doped oxide is borosilicate glass.

17. A horizontal nanosheet or horizontal nanowire device, comprising:
   a source electrode;
   a drain electrode;
   a gate stack between the source electrode and the drain electrode;
   a first doped internal spacer separating the source electrode from the gate stack;
   a second doped internal spacer separating the drain electrode from the gate stack;
   a channel region under the gate stack, the channel region extending between the source electrode and the drain electrode; and
   the source electrode and the drain electrode each comprising a doped extension region, the doped extension region of the source electrode being under at least a portion of the first doped internal spacer and the doped extension region of the drain electrode being under at least a portion of the second doped internal spacer, wherein the doped extension regions of the source and drain electrodes are aligned with the gate stack.

18. The horizontal nanosheet or horizontal nanowire device of claim 17, wherein the first and second doped internal spacers are etch-resistant, non-sacrificial spacers.

19. The horizontal nanosheet or horizontal nanowire device of claim 17, wherein at least one of the first doped internal spacer or the second doped internal spacer comprises a first region having a first concentration of dopants and a second region having a second concentration of dopants different than the first concentration of dopants.

20. A method of forming a horizontal nanosheet device or a horizontal nanowire device, the method comprising:
   forming a dummy gate and a plurality of external spacers on a stack comprising an alternating arrangement of sacrificial layers and channel layers;
   deep etching portions of the stack between the plurality of external spacers to form electrode recesses for a source electrode and a drain electrode;
   performing an etch-back on portions of the sacrificial layers to form internal spacer recesses above and below each of the channel layers;
   forming doped internal spacers in the internal spacer recesses, wherein the doped internal spacers each comprise a doped oxide;
   forming doped extension regions of the source electrode and the drain electrode by outdiffusion of dopants from the doped internal spacers;
   epitaxially regrowing the source electrode and the drain electrode in the electrode recesses;
   etching remaining portions of the sacrificial layers and the dummy gate to form cavities; and
   forming gate stacks in the cavities,
      wherein the forming of the doped extension regions self-aligns the doped extension regions of the source and drain electrodes with the gate stacks.

* * * * *